(12) United States Patent
Tsuchida et al.

(10) Patent No.: US 10,354,867 B2
(45) Date of Patent: Jul. 16, 2019

(54) EPITAXIAL WAFER MANUFACTURING METHOD, EPITAXIAL WAFER, SEMICONDUCTOR DEVICE MANUFACTURING METHOD, AND SEMICONDUCTOR DEVICE

(71) Applicant: FUJI ELECTRIC CO., LTD., Kawasaki-shi, Kanagawa (JP)

(72) Inventors: Hidekazu Tsuchida, Yokosuka (JP); Tetsuya Miyazawa, Yokosuka (JP); Yoshiyuki Yonezawa, Tsukuba (JP); Tomohisa Kato, Tsukuba (JP); Kazutoshi Kojima, Tsukuba (JP); Takeshi Tawara, Tsukuba (JP); Akihiro Otsuki, Mitaka (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 15/712,644

(22) Filed: Sep. 22, 2017

(65) Prior Publication Data

US 2018/0012758 A1    Jan. 11, 2018

Related U.S. Application Data

(63) Continuation of application No. PCT/JP2016/082115, filed on Oct. 28, 2016.

(30) Foreign Application Priority Data

Oct. 30, 2015    (JP) ................................. 2015-214758

(51) Int. Cl.
*H01L 29/36*    (2006.01)
*H01L 21/02*    (2006.01)
(Continued)

(52) U.S. Cl.
CPC ...... *H01L 21/02529* (2013.01); *C23C 16/325* (2013.01); *C23C 16/56* (2013.01);
(Continued)

(58) Field of Classification Search
None
See application file for complete search history.

(56) References Cited

U.S. PATENT DOCUMENTS 3,579,815 A * 5/1971 Gentry ............... H01L 21/00
                                                148/DIG. 145
5,032,540 A * 7/1991 Follegot ............ H01L 21/221
                                                257/E21.137
(Continued)

FOREIGN PATENT DOCUMENTS

| JP | 2006-28016 | 2/2006 |
| JP | 4364945 | 8/2009 |

(Continued)

OTHER PUBLICATIONS

J.J. Sumakeris et al., "Approaches to Stabilizing the Forward Voltage of Bipolar SiC Devices", Materials Science Forum, vol. 457-460, 2004, pp. 1113-1116, online at http://www.scientific.net.
(Continued)

*Primary Examiner* — Michael Lebentritt

(57) ABSTRACT

A method for manufacturing an epitaxial wafer comprising a silicon carbide substrate and a silicon carbide voltage-blocking-layer, the method includes: epitaxially growing a buffer layer on the substrate, doping a main dopant for determining a conductivity type of the buffer layer and doping an auxiliary dopant for capturing minority carriers in the buffer layer at a doping concentration less than the doping concentration of the main dopant, so that the buffer layer enhances capturing and extinction of the minority carriers, the minority carriers flowing in a direction from the voltage-blocking-layer to the substrate, so that the buffer
(Continued)

layer has a lower resistivity than the voltage-blocking-layer, and so that the buffer layer includes silicon carbide as a main component; and epitaxially growing the voltage-blocking-layer on the buffer layer.

18 Claims, 7 Drawing Sheets

(51) Int. Cl.
C30B 25/20 (2006.01)
C30B 29/36 (2006.01)
H01L 29/861 (2006.01)
H01L 29/868 (2006.01)
H01L 21/04 (2006.01)
H01L 29/16 (2006.01)
C23C 16/32 (2006.01)
C30B 25/18 (2006.01)
C23C 16/56 (2006.01)
H01L 29/66 (2006.01)
H01L 29/06 (2006.01)
H01L 29/737 (2006.01)
H01L 29/739 (2006.01)
H01L 29/74 (2006.01)
H01L 29/78 (2006.01)

(52) U.S. Cl.
CPC ............ *C30B 25/183* (2013.01); *C30B 25/20* (2013.01); *C30B 29/36* (2013.01); *H01L 21/0262* (2013.01); *H01L 21/02378* (2013.01); *H01L 21/02433* (2013.01); *H01L 21/02447* (2013.01); *H01L 21/02576* (2013.01); *H01L 21/02579* (2013.01); *H01L 21/02581* (2013.01); *H01L 21/046* (2013.01); *H01L 29/0619* (2013.01); *H01L 29/16* (2013.01); *H01L 29/1608* (2013.01); *H01L 29/6606* (2013.01); *H01L 29/7371* (2013.01); *H01L 29/861* (2013.01); *H01L 29/868* (2013.01); *H01L 29/7395* (2013.01); *H01L 29/74* (2013.01); *H01L 29/78* (2013.01)

(56) References Cited

U.S. PATENT DOCUMENTS

| 5,455,442 | A | * | 10/1995 | Neilson | H01L 24/05 257/124 |
| 5,661,314 | A | * | 8/1997 | Merrill | H01L 29/66333 257/144 |
| 5,814,546 | A | | 9/1998 | Hermansson | |
| 6,008,092 | A | * | 12/1999 | Gould | H01L 21/221 257/345 |
| 7,531,433 | B2 | | 5/2009 | Ellison et al. | |
| 8,492,772 | B2 | | 7/2013 | Ellison et al. | |
| 2006/0006394 | A1 | * | 1/2006 | Kordina | H01L 29/0692 257/77 |
| 2006/0011128 | A1 | | 1/2006 | Ellison et al. | |
| 2009/0230406 | A1 | | 9/2009 | Ellison et al. | |
| 2015/0028353 | A1 | * | 1/2015 | Mandal | H01L 31/036 257/77 |
| 2016/0322472 | A1 | * | 11/2016 | Schloegl | H01L 29/66325 |

FOREIGN PATENT DOCUMENTS

JP 2011-109018 6/2011
JP 2012-4318 1/2012

OTHER PUBLICATIONS

International Search Report dated, Dec. 6, 2016 corresponding to International Patent Application No. PCT/JP2016/082115.
English Translation by WIPO of the International Preliminary Report on Patentability for International Patent Application No. PCT/JP2016/082115, dated May 11, 2018, 5 pgs.

* cited by examiner

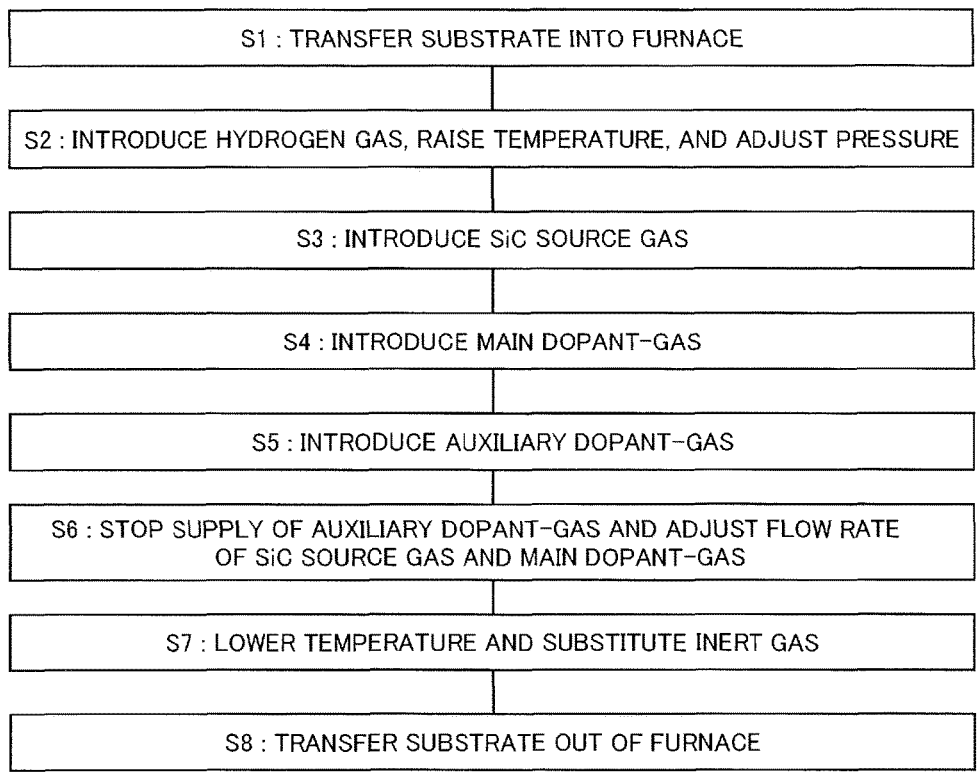

EPITAXIAL WAFER MANUFACTURING METHOD, EPITAXIAL WAFER, SEMICONDUCTOR DEVICE MANUFACTURING METHOD, AND SEMICONDUCTOR DEVICE

CROSS REFERENCE TO RELATED APPLICATIONS AND INCORPORATION BY REFERENCE

This application claims benefit of priority under 35 USC 111(a) based on International Application No. PCT/JP2016/082115 filed on Oct. 28, 2016, and further claims benefit of foreign priority under 35 USC 119 based on JP2015-214758 filed on Oct. 30, 2015, the entire contents of which are incorporated by reference herein.

BACKGROUND OF THE INVENTION

1. Field of the Invention

The present invention relates to an epitaxial wafer manufacturing method, an epitaxial wafer, a semiconductor device manufacturing method, and a semiconductor device, and more particularly, to a technique to manufacture an epitaxial wafer made of silicon carbide semiconductor.

2. Description of the Related Art

A lot of crystal defects and dislocations exist in an epitaxial wafer obtained by epitaxially growing silicon carbide (SiC) on a substrate. The crystal defects and dislocations are considered to make have adverse effects on the characteristics of SiC semiconductor devices. In particular, a basal plane dislocation (BPD) in an epitaxial growth layer expands to a stacking fault in a bipolar operation in the semiconductor device and a current is less likely to flow. Therefore, an on-state voltage of the semiconductor device increases and "bipolar degradation" occurs.

Several hundreds to several thousands of BPDs exist per square centimeter in the substrate. Most of the BPDs are converted into threading edge dislocations (TEDs) during epitaxial growth. However, a problem that the remaining BPDs penetrate up to at a surface and expand to be in triangular-shaped stacking faults occurs. The problem is being solved by improving epitaxial growth conditions to increase the efficiency of the conversion such that almost all of the BPDs are converted. However, in recent years, the expansion of a stacking fault in a bar shape has been reported, which causes a new problem for practical use of the SiC semiconductor device in which a bipolar operation occurs as recited in Non-Patent Literature (NPTL) 1.

In NPTL 1, a recombination electrons and holes in the semiconductor substrate is pointed as a factor which causes the expansion of the bar-shaped stacking fault. A scheme to increase the thickness of a buffer layer, which is epitaxially grown on a semiconductor substrate of a semiconductor device to prevent an excessively large number of holes from being injected into the semiconductor substrate, so as to suppress the recombination, is disclosed in NPTL 1. However, growing the thick buffer layer is not preferable, because costs increase owing to reduction of throughput of the process for epitaxial growth, and yield is reduced owing to increase of the defect density, and further, the resistance of the epitaxial wafer increases. Therefore, a technique to prevent the bar-shaped stacking fault is required, minimizing a thickness of the buffer layer.

[NPTL 1] J. J. Sumakeris et al., "Approaches to Stabilizing the Forward Voltage of Bipolar SiC Devices", (USA), Materials Science Forum, Online Vol. 457-460, 2004, pp. 1113-1116

SUMMARY OF THE INVENTION

The present invention has been made in view of the above-mentioned problems and an object of the present invention is to provide an epitaxial wafer manufacturing method, an epitaxial wafer, a semiconductor device manufacturing method, and a semiconductor device which can effectively prevent the occurrence of bar-shaped stacking faults expanding from the interface between a substrate and an epitaxial growth layer on the substrate even in a bipolar operation with a large amount of current while suppressing the thickness of the epitaxial growth layer.

In order to solve the above-mentioned problems, an aspect of a present invention inheres in a method for manufacturing an epitaxial wafer, which has a silicon carbide substrate and a silicon carbide voltage-blocking-layer. The method for manufacturing an epitaxial wafer includes epitaxially growing a buffer layer on the substrate, doping a main dopant for determining a conductivity type of the buffer layer and doping an auxiliary dopant for capturing minority carriers to the substrate at a doping concentration less than the doping concentration of the main dopant, so that the buffer layer enhances capturing and extinction of the minority carriers, the minority carriers flowing in a direction from the voltage-blocking-layer to the substrate, so that the buffer layer has a lower resistivity than the voltage-blocking-layer, and so that the buffer layer includes silicon carbide as a main component; and epitaxially growing the voltage-blocking-layer on the buffer layer.

Another aspect of a present invention inheres in a method for manufacturing an epitaxial wafer, which has a silicon carbide substrate and a silicon carbide voltage-blocking-layer. The method for manufacturing an epitaxial wafer includes epitaxially growing a single-crystalline layer including silicon carbide as a main component on the substrate, doping a main dopant for determining a conductivity type of the single-crystalline layer; implanting ions of an auxiliary dopant for capturing minority carriers into the single-crystalline layer with a dose such that a doping concentration of the auxiliary dopant is less than the doping concentration of the main dopant; activating the ions to form a buffer layer using the single-crystalline layer, so that the buffer layer enhances capturing and extinction of the minority carriers, the minority carriers flowing in a direction from the voltage-blocking-layer to the substrate, and so that the buffer layer has a lower resistivity than the voltage-blocking-layer; and epitaxially growing the voltage-blocking-layer on the buffer layer.

Still another aspect of a present invention inheres in an epitaxial wafer, which has a silicon carbide substrate and a silicon carbide voltage-blocking-layer. The epitaxial wafer includes a buffer layer provided between the substrate and the voltage-blocking-layer, the buffer layer being doped with a main dopant for determining a conductivity type and an auxiliary dopant for capturing minority carriers, the auxiliary dopant having a lower doping concentration than the doping concentration of the main dopant, the buffer layer enhances capturing and extinction of the minority carriers, the minority carriers flowing in a direction from the voltage-blocking-layer to the substrate, the buffer layer having a lower resistivity than the voltage-blocking-layer, the buffer layer including silicon carbide as a main component.

Yet still another aspect of a present invention inheres in a method for manufacturing a semiconductor device using the epitaxial wafer manufactured by the above aspect of the epitaxial wafer manufacturing method, which has a silicon carbide substrate and a silicon carbide voltage-blocking-layer. The method for manufacturing a semiconductor device includes a process of forming a semiconductor region of a second conductivity type in a portion of an upper part of the voltage-blocking-layer of a first conductivity type.

Yet still another aspect of a present invention inheres in a method for manufacturing a semiconductor device using the epitaxial wafer manufactured by the above another aspect of the epitaxial wafer manufacturing method, which has the silicon carbide substrate and the silicon carbide voltage-blocking-layer. The method for manufacturing the semiconductor device includes a process of forming a semiconductor region of a second conductivity type in a portion of an upper part of the voltage-blocking-layer of a first conductivity type.

Yet still another aspect of a present invention inheres in a semiconductor device using the epitaxial wafer having the silicon carbide substrate and the silicon carbide voltage-blocking-layer, which has been prescribed in the above aspect. The semiconductor device includes a semiconductor region of a second conductivity type provided in a portion of an upper part of the voltage-blocking-layer of a first conductivity type.

BRIEF DESCRIPTION OF THE DRAWINGS

FIG. 1 is a flowchart illustrating an epitaxial wafer manufacturing method according to a first embodiment;

FIG. 2A illustrates an example of a combination mode of impurity elements used to set a main dopant and an auxiliary dopant;

FIG. 2B illustrates another example of the combination mode of the impurity elements used to set the main dopant and the auxiliary dopant;

DETAILED DESCRIPTION OF THE PREFERRED EMBODIMENTS

Figure 3:
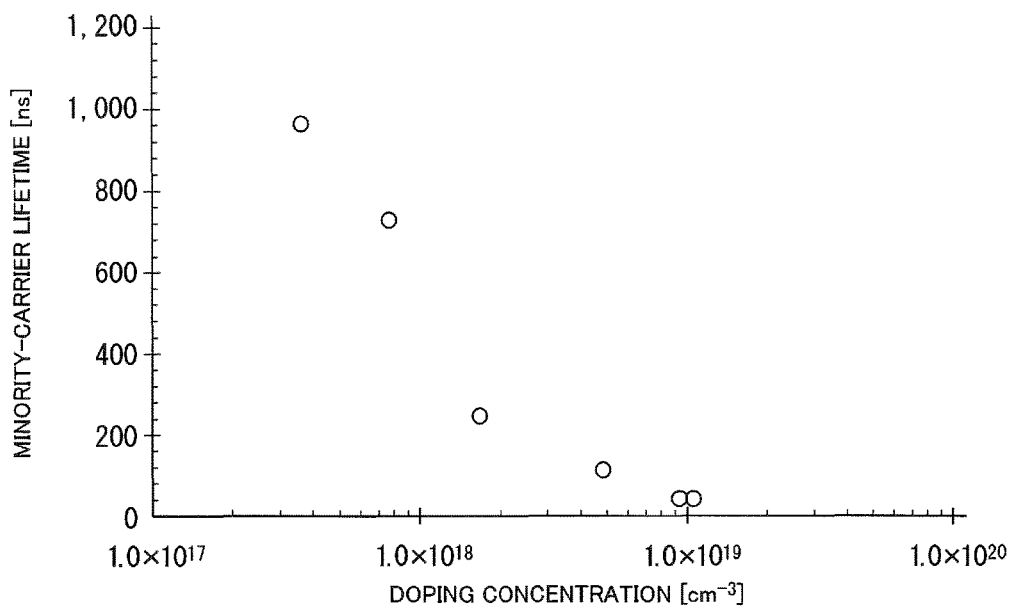
FIG. 3 is a graph illustrating the relationship between the doping concentration of the main dopant and the lifetime of a minority carrier.

Hereinafter, first and second embodiments of the present invention will be described. In the following description of the drawings, the same or similar portions are denoted by the same or similar reference numerals. However, the drawings are schematically illustrated and it is noted that, for example, the relationship between thicknesses and plane dimensions and the ratio of the thickness of each device or each member are different from actual relationship and ratio. Therefore, detailed thicknesses or dimensions are determined with reference to the following description. Of course, in the drawings, portions have different dimension relationship or different dimension ratios.

In the following description, the "left-right" direction or the "up-down" direction is simply defined for convenience of explanation and does not limit the technical spirit of the present invention. Therefore, for example, when the plane of paper is rotated 90 degrees, the "left-right" direction is changed to the "up-down" direction and the "up-down" direction is changed to the "left-right" direction. When the plane of paper is rotated 180 degrees, the "left" side is changed to the "right" side and the "right" side is changed to the "left" side. In the specification and the accompanying drawings, in the layers or regions appended with "n" or "p", an electron or a hole means a majority carrier. In addition, symbols "+" and "−" added to n or p mean that the impurity concentration of a semiconductor region is higher and lower than that of a semiconductor region without the symbols.

<First Embodiment>
(Epitaxial Wafer Manufacturing Method)

An epitaxial wafer manufacturing method according to a first embodiment will be described with reference to a flowchart illustrated in FIG. 1.

First, a substrate made of SiC is prepared and is transferred into an epitaxial growth furnace (Step S1). Next, hydrogen ($H_2$) gas is introduced into the furnace, an internal pressure of the furnace is adjusted to about 1300 Pa to 40000 Pa, and temperature of inside of the furnace is raised to 1600° C. to 1700° C. (Step S2). Then, source gases of SiC is introduced (Step S3), a main dopant-gas including a main dopant which determines a conductivity type is introduced (Step S4), and an auxiliary dopant-gas including an auxiliary dopant which captures minority carriers is introduced (Step S5). Steps S3 to S5 may be executed at the same time or may be executed at different times. For example, Step S5 may be executed a little later than Step S4. A buffer layer which includes SiC as a main component is grown on the substrate by the above-mentioned process. The buffer layer enhances capturing of the minority carriers, which flow in a direction from a voltage-blocking-layer to the substrate, so as to extinct the minority carriers.

Then, supplying the auxiliary dopant-gas is stopped and flow rates of the source gas of SiC and the main dopant-gas are adjusted such that the voltage-blocking-layer is grown (Step S6). The voltage-blocking-layer with a higher resistivity than the buffer layer is formed on the buffer layer. That is, the buffer layer and the voltage-blocking-layer are implemented such that the resistivity of the buffer layer is lower than the resistivity of the voltage-blocking-layer. Then, after temperature is lowered and the inert gas is substituted (Step S7), the wafer (substrate) is transferred out of the furnace (Step S8). The buffer layer and the voltage-blocking-layer are continuously grown. However, the buffer layer and the voltage-blocking-layer may be separately deposited. In the separately depositing, after Steps S1 to S5, Steps S7 and S8 are executed to grow the buffer layer, and then, a process that is equivalent to Steps S1 to S4, and a process that is equivalent to Steps S7 and S8 are executed to implement the voltage-blocking-layer. As mentioned above, an epitaxial wafer according to the first embodiment is manufactured.

A combination mode of the main dopant and the auxiliary dopant in the first embodiment is as follows. For example, as illustrated in FIG. 2A, when nitrogen (N) which is an impurity element for implementing donor-levels is selected as the main dopant, at least one of aluminum (Al), boron (B), vanadium (V), titanium (Ti), iron (Fe), and chromium (Cr) can be selected as an impurity element which is the auxiliary dopant.

In addition, for example, as illustrated in FIG. 2B, when Al which is an impurity element for implementing acceptor-levels is selected as the main dopant, at least one of N, B, V, Ti, Fe, and Cr can be selected as an impurity element which is the auxiliary dopant.

That the doping concentration of the auxiliary dopant be lower than the doping concentration of the main dopant and is equal to or greater than about $1\times10^{14}$ cm$^{-3}$ and equal to or less than about $5\times10^{18}$ cm$^{-3}$ is preferable. When the doping concentration of the auxiliary dopant is less than about $1\times10^{14}$ cm$^{-3}$, the capture of the minority carriers is not sufficient and it is difficult to effectively prevent the occurrence of bar-shaped stacking faults. In contrast, when the doping concentration of the auxiliary dopant is equal to or less than the doping concentration of the main dopant and is equal to or greater than about $5\times10^{18}$ cm$^{-3}$, the doping concentration is too high, which causes, for example, an increase of the resistivity or a reduction of the breakdown voltage in the epitaxial layer.

As illustrated in a graph of FIG. 3, higher the doping concentration of the main dopant is, shorter the lifetime of the minority carrier is. In particular, in a region in which the doping concentration is in $1\times10^{17}$ cm$^{-3}$ order level, the lifetime of the minority carrier is about 700 nanoseconds or 1000 nanoseconds. In contrast, in a high-concentration region with a doping concentration which is equal to or greater than about $1\times10^{18}$ cm$^{-3}$, the lifetime of the minority carrier is equal to or less than about 300 nanoseconds, which is very short. The shorter lifetime of the minority carrier is presumed to be ascribed to Auger recombination mechanism.

When the doping concentration of the main dopant is equal to or greater than about $1\times10^{19}$ cm$^{-3}$, double-Shockley-type stacking faults are likely to occur. Therefore, it is preferable that the doping concentration of the main dopant is equal to or greater than about $1\times10^{18}$ cm$^{-3}$ and less than about $1\times10^{19}$ cm$^{-3}$.

Figure 4:
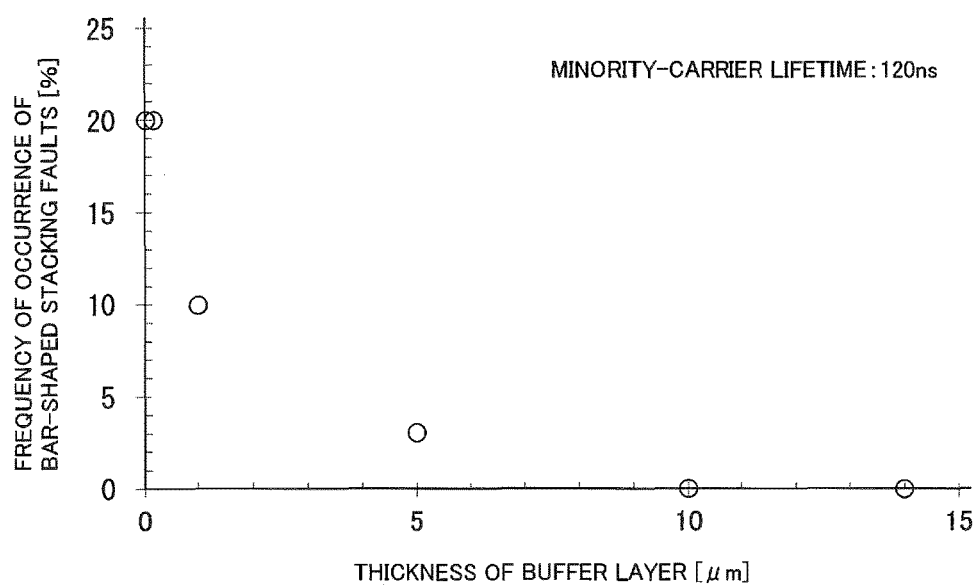
FIG. 4 is a graph illustrating the relationship between the thickness of a buffer layer and the frequency of occurrence of bar-shaped stacking faults.

In a buffer layer of a p-i-n diode used in FIG. 4, the thickness of an n-type buffer layer is changed when the doping concentration of the main dopant is increased such that the lifetime of the minority carrier at a temperature of about 250° C. is about 120 nanoseconds.

In addition, an n-type voltage-blocking-layer for maintaining the breakdown voltage of the semiconductor device is stacked on the buffer layer of the p-i-n diode and is grown as a high-resistivity epitaxial layer. The thickness of the voltage-blocking-layer is about ten micrometers and the doping concentration of impurity elements is about $1\times10^{16}$ cm$^{-3}$.

Al ions as impurity elements are implanted in a portion of the upper part of the voltage-blocking-layer to serve a p-type anode region. The anode region is set to a box profile with a thickness of about 0.3 micrometer and an Al doping concentration of about $1\times10^{20}$ cm$^{-3}$. In addition, an anode electrode is laminated on a top surface of the anode region and a cathode electrode is provided on a bottom surface of the substrate serving an n-type cathode region on the rear surface side. In order to increase the breakdown voltage of an end portion of the p-i-n diode, Al ions are implanted around the anode region formed in the upper part of the voltage-blocking-layer to further implement a p-type semiconductor region having a lower concentration than the anode region, which serves as a junction terminal extension (JTE) structure.

As illustrated in FIG. 4, thicker the thickness of the buffer layer of the epitaxial wafer is, lower the frequency of occurrence of the bar-shaped stacking faults is. As the results illustrated in FIG. 4, when the lifetime of the minority carrier is about 120 nanoseconds, the thickness of the buffer layer is preferably equal to or greater than at least ten micrometers in order to achieve no occurrence of the bar-shaped stacking fault. The thickness of the buffer layer is preferably equal to or greater than 15 micrometers in order to further improve reliability.

However, as the thickness of the buffer layer increases, the cost of growth-process of epitaxial growth increases. The present inventors tried to further shorten the lifetime of the minority carrier and to reduce the thickness of the buffer layer in order to establish a change point in which the frequency of occurrence of the bar-shaped stacking fault was zero. Then, the inventors found that the frequency of occurrence of the bar-shaped stacking faults could be significantly reduced, even if the thickness of the buffer layer was limited to, for example, about five micrometers or less. An example of the result of the experiment conducted on the basis of the findings is illustrated in a graph of FIG. 5.

Figure 5:
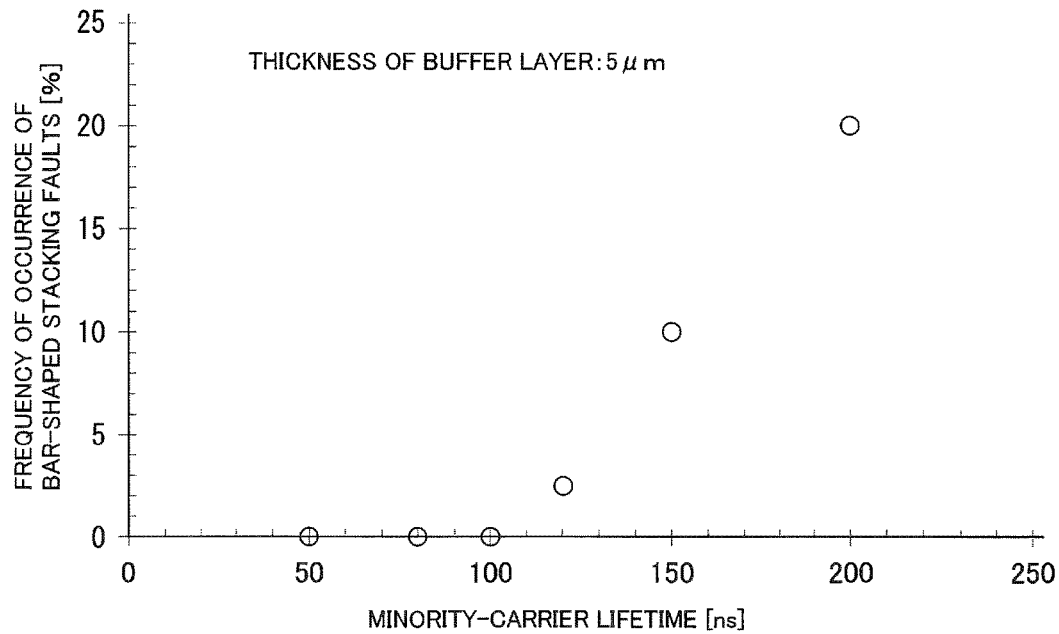
FIG. 5 is a graph illustrating the relationship between the lifetime of the minority carrier and the frequency of occurrence of the bar-shaped stacking faults.

FIG. 5 illustrates the result of investigation on the relationship between the lifetime of the minority carrier and the frequency of occurrence of the bar-shaped stacking faults when a current flows at a current density of 600 A/cm$^2$ for about one hour through a p-i-n diode, in which a buffer layer is grown with a thickness of about five micrometers while the lifetime of the minority carrier in the buffer layer is changed.

As illustrated in FIG. 5, shorter the lifetime of the minority carrier is, smaller the frequency of occurrence of the bar-shaped stacking faults is. In particular, when the lifetime of the minority carrier is equal to or less than 100 nanoseconds, the frequency of occurrence of the bar-shaped stacking faults is zero. A method of increasing the concentration of the main dopant is available as an example of a method for shortening the lifetime of the minority carrier. However, it is difficult to sufficiently shorten the lifetime of the minority carrier because the above-mentioned double-Shockley-type stacking fault will occur. Then, the inventors increased the concentration of the auxiliary dopant establishing deep levels in order to obtain a short minority-carrier lifetime equal to or less than 100 nanoseconds. As mentioned above, the inventors could prevent the occurrence of the bar-shaped stacking faults with a buffer layer with about five micrometers thickness which is available for practical use. In principle, as the lifetime of the minority carrier is shortened more, the thickness of the buffer layer can be reduced more. However, when the thickness of the buffer layer is reduced to 0.1 micrometer or less, it is difficult to control the thickness. Therefore, the thickness of the buffer layer is preferably equal to or greater than about 0.1 micrometer and equal to or less than about five micrometers.

JP Patent No. 4364945 discloses a method of introducing impurities for generating recombination centers during epitaxial growth so as to shorten the lifetime of the minority carrier. However, the examination results of the inventors proved that the effectivity of shortening the lifetime of the minority carrier by using of the recombination centers in the prior art was reduced at a high temperature of about 150° C. or more, and the lifetime increased. For example, as illustrated in data points represented by marks of open circles in FIG. 6, in the case of an epitaxial wafer in which the concentration of N, which is the main dopant, is about $5\times10^{17}$ cm$^{-3}$, the lifetime of the minority carrier is greater than 40 nanoseconds at a temperature of 150° C. and is equal to or greater than 170 nanoseconds at a temperature of 250° C.

Figure 6:
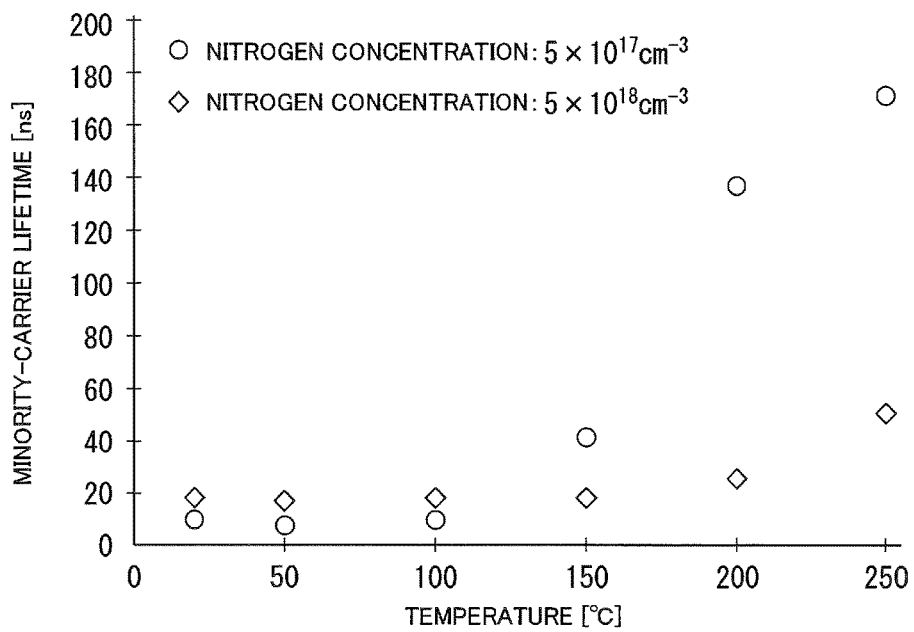
FIG. 6 is a graph illustrating the dependence of the lifetime of the minority carrier on temperature.

In contrast, as represented by rhombic data points in FIG. 6, in the method of increasing the concentration of the main dopant to about $1\times10^{18}$ cm$^{-3}$ or more proposed by the inventors, minority-carrier lifetimes were maintained shortly even at a high temperature of about 150° C. or more. In the epitaxial wafer represented by the rhombic data points, the concentration of N, which was the main dopant, was about $5\times10^{18}$ cm$^{-3}$. In addition, the minority-carrier lifetimes were maintained at about 20 nanoseconds at a temperature of 150° C. and it was possible to maintain the lifetime less than 60 nanoseconds at a temperature of 250° C. The reason why the lifetimes were maintained shortly was that the method using the Auger recombination mechanism, which is proposed by the present inventors, has a behavior of smaller dependence on temperature, while the recombination mechanism using the recombination centers does not effectively operate at a high temperature.
(Semiconductor Device Manufacturing Method)

Next, the semiconductor device manufacturing method according to the first embodiment will be described, using an example in which a p-i-n diode is manufactured, with reference to FIGS. 7 to 9.

Figure 7:
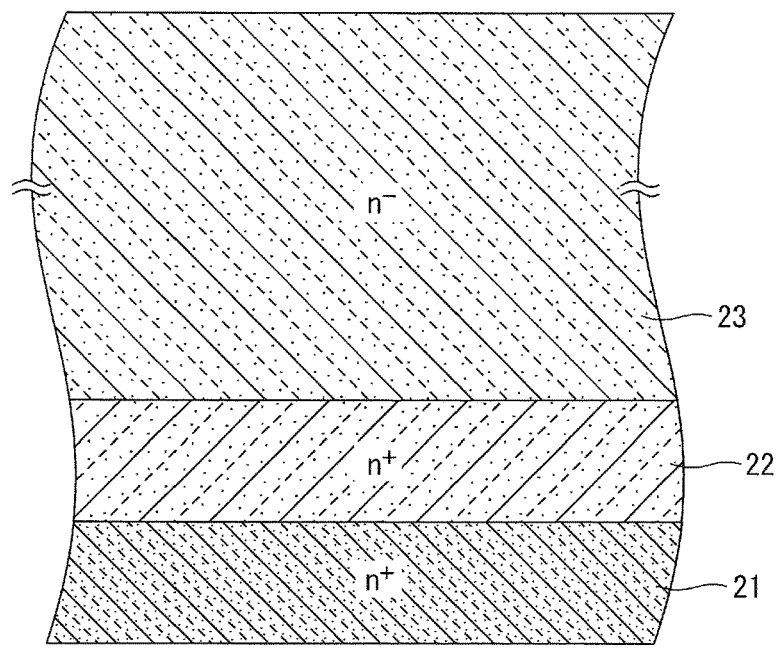
FIG. 7 is a process flow cross-sectional view illustrating a semiconductor device manufacturing method pertaining to the first embodiment (part 1)

First, an epitaxial wafer illustrated in the cross-sectional view of FIG. 7 is prepared as a semiconductor wafer. FIG. 7 illustrates the epitaxial wafer having a triple-layer structure including an n$^+$-type SiC substrate 21 which will serve a cathode region, a high-concentration n$^+$-type buffer layer 22 which is provided on the substrate 21, and a low-concentration n$^-$-type voltage-blocking-layer 23 which is provided on the buffer layer 22. The voltage-blocking-layer 23 functions as an intrinsic semiconductor layer (i-layer) of a p-i-n diode.

Figure 8:
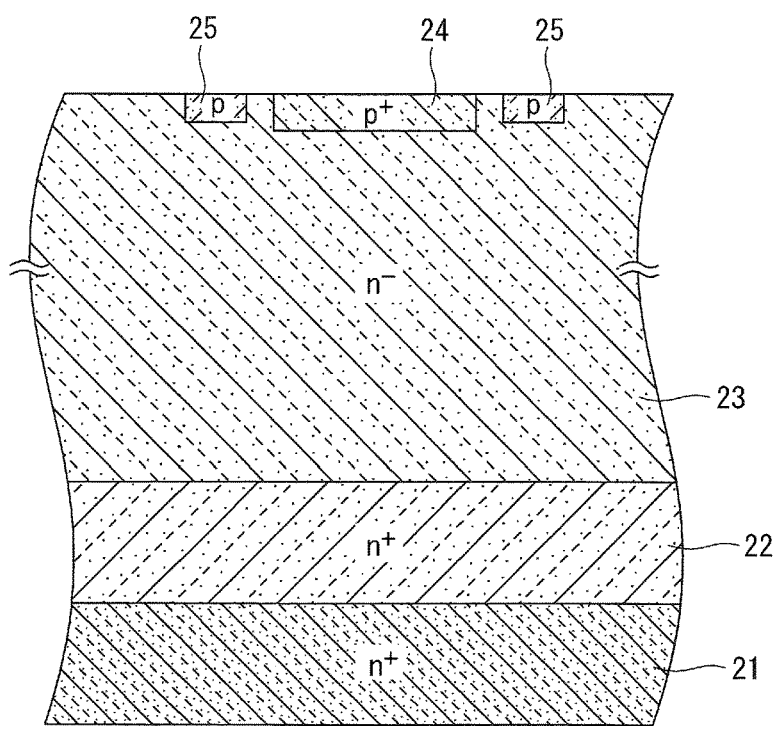
FIG. 8 is a process flow cross-sectional view illustrating the semiconductor device manufacturing method pertaining to the first embodiment (part 2)

Next, as illustrated in a cross-sectional view of FIG. 8, p-type Al ions are implanted into a surface of the voltage-blocking-layer 23 which is opposite to the buffer layer 22 by, for example, an ion implantation method. After the ion implantation, a predetermined activation process is executed to implement a high-concentration p$^+$-type anode region 24 in a portion of the upper part of the voltage-blocking-layer 23. The anode region 24 corresponds to "a semiconductor region of a second conductivity type" according to the present invention. FIG. 8 illustrates the p-i-n diode in which Al ions are implanted to further implement p-type semiconductor regions 25, 25 having a lower concentration than the anode region 24 in order to implement JTE structure in the upper part of the voltage-blocking-layer 23 around the anode region 24.

Figure 9:
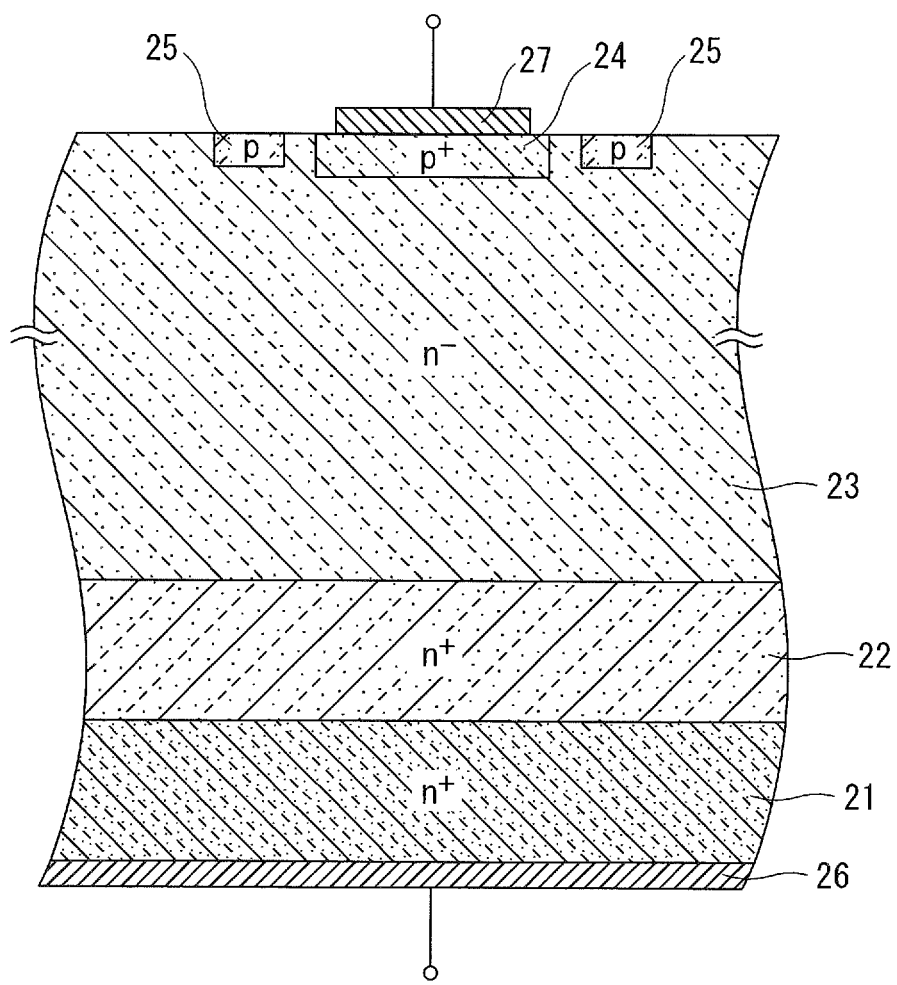
FIG. 9 is a process flow cross-sectional view illustrating the semiconductor device manufacturing method pertaining to the first embodiment (part 3)

Next, as illustrated in a cross-sectional view of FIG. 9, an anode electrode 27 which is made of, nickel (Ni) etc. is laminated on a top surface of the anode region 24 and a cathode electrode 26 is laminated on a bottom surface of a cathode region which is the substrate 21 serving the bottom surface side. The p-i-n diode having the buffer layer 22 on the cathode side is manufactured as the semiconductor device by a series of processes described with reference to FIGS. 7 to 9.

According to the semiconductor device manufacturing method of the first embodiment, the capture of the minority carriers is actively promoted by the buffer layer 22 of the epitaxial wafer. Therefore, it is possible to manufacture a semiconductor device, which can effectively prevent the occurrence of bar-shaped stacking faults expanding from the interface between the buffer layer 22 and the substrate 21 during a bipolar operation with a large amount of current while suppressing the thickness of the buffer layer 22.

EXAMPLE 1

Next, Example 1 using the semiconductor device manufacturing method according to the first embodiment will be described. First, a substrate which was a SiC substrate was prepared and a Si-face of an n$^+$-type 4H—SiC substrate which was 4° off from <11-20> direction and had a diameter ($\phi$) of 3 inches was polished by chemical mechanical polishing (CMP) and the substrate was transferred into an epitaxial growth apparatus. Then, as source gases, H$_2$, monosilane (SiH$_4$), propane (C$_3$H$_8$), nitrogen (N$_2$), and triethylboron (C$_6$H$_{15}$B) were introduced in an atmosphere of a temperature of about 1680° C. and a pressure of about 10.3 kPa. H$_2$ was introduced at a flow rate of about $1.69\times10^2$ Pa·m$^3$/s (about 100 slm), SiH$_4$ was introduced at a flow rate of about $143.65\times10^{-3}$ Pa·m$^3$/s (about 85 sccm), C$_3$H$_8$ was introduced at a flow rate of about $38.87\times10^{-3}$ Pa·m$^3$/s (about 23 sccm), N$_2$ was introduced at a flow rate of about $84.5\times10^{-3}$ Pa·m$^3$/s (about 50 sccm), and C$_6$H$_{15}$B was introduced at a flow rate of about $16.9\times10^{-3}$ Pa·m$^3$/s (about 10 sccm). A SiC single-crystalline layer was epitaxially grown for about 30 minutes. N was a main dopant and B was an auxiliary dopant.

Then, an epitaxial growth layer was grown with a thickness of about five micrometers on the Si-face of the substrate and a buffer layer in which N was added at a doping concentration of about $5\times10^{18}$ cm$^{-3}$ and B was added at a doping concentration of about $1\times10^{15}$ cm$^{-3}$. That is, in the Example 1, in the epitaxial growth apparatus, N and B were added into the SiC single-crystalline layer at the same time while the doping concentration of N and B was controlled to epitaxially grow the buffer layer.

Next, among the epitaxial growth conditions of the buffer layer, the flow rate of SiH$_4$ was changed to about $312.65\times10^{-3}$ Pa·m$^3$/s (about 185 sccm), the flow rate of C$_3$H$_8$ was changed to about $116.61\times10^{-3}$ Pa·m$^3$/s (about 69 sccm), and the flow rate of N$_2$ was changed to about $8.45\times10^{-3}$ Pa·m$^3$/s (about 5 sccm). The introduction conditions of the other source gases were the same as described above. Under the epitaxial growth conditions, the SiC single-crystalline layer was epitaxially grown for about seven hours. Then, a voltage-blocking-layer doped with N at a doping concentration of about $1\times10^{14}$ cm$^{-3}$ was epitaxially grown with a thickness of about 120 micrometers on the buffer layer.

Then, Al ions as impurity elements was implanted for a portion of the upper part of the voltage-blocking-layer, to implement an anode region set to a box profile with a thickness of about 0.3 micrometer and a doping concentration of about $1\times10^{20}$ cm$^{-3}$. In addition, an anode electrode was laminated on a top surface of the anode region and a cathode electrode was laminated on a bottom surface of the substrate. In order to improve the breakdown voltage of an end portion of the semiconductor device, Al ions were implanted around the anode region in the upper part of the voltage-blocking-layer to further implement p-type semiconductor regions having a lower concentration than the anode region. Then, a plurality of p-i-n diodes having a JTE structure was manufactured.

The lifetime of the minority-carriers in the buffer layer at a temperature of 250° C. was controlled and set to 50 nanoseconds by adjustment of the doping concentration of the main dopant and the auxiliary dopant. Then, an electrical conduction test was executed for each p-i-n diode at a current density of 600 A/cm² for about one hour and the frequency of occurrence of bar-shaped stacking faults was examined.

The results of the electrical conduction test provided that, in the p-i-n diode according to the Example 1, even when the thickness of the buffer layer was about five micrometers, no bar-shaped stacking fault occurred and it was possible to achieve appropriately both to suppress an increase in the thickness of the buffer layer and to improve the quality of the p-i-n diode as a product.

COMPARATIVE EXAMPLE

Figure 10:
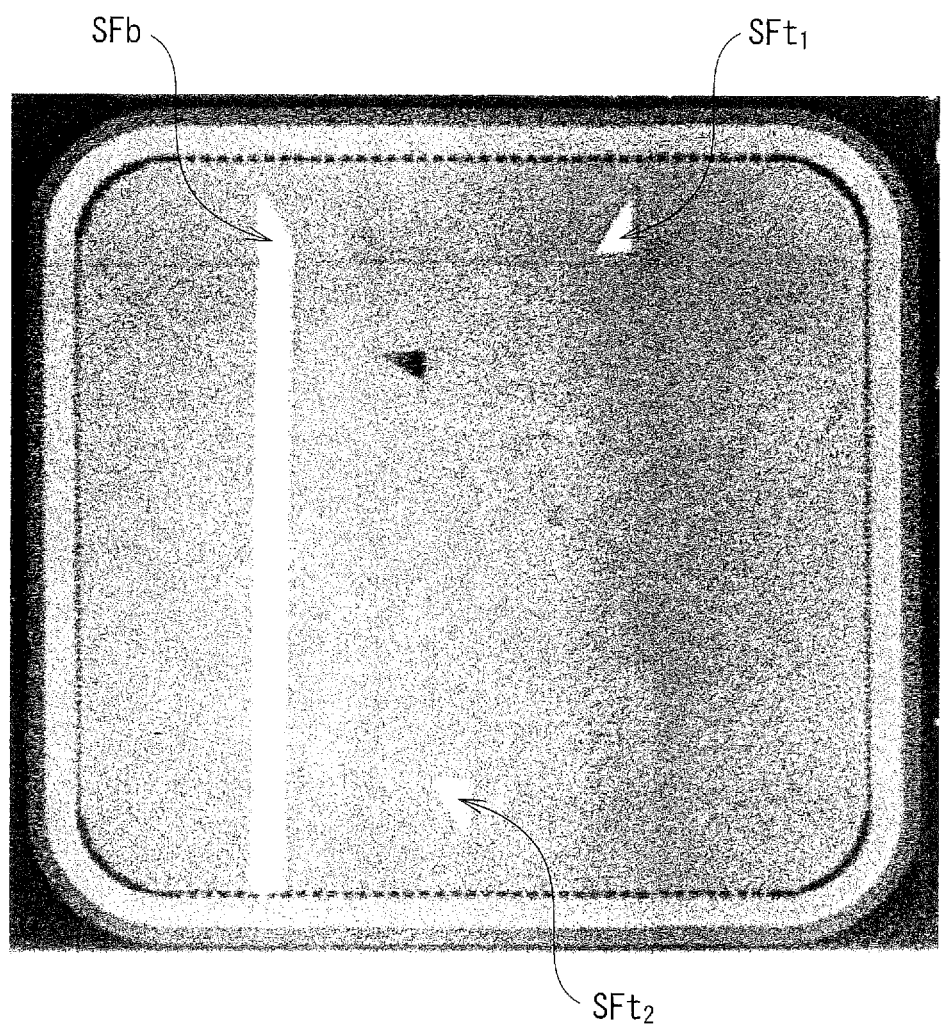
FIG. 10 is a top view illustrating a captured image of the photoluminescence emission of stacking faults that occurs in an epitaxial wafer according to Comparative Example.

In contrast, a p-i-n diode in which the lifetime of minority carriers was not controlled by the adjustment of the doping concentration of a main dopant and an auxiliary dopant was prepared as Comparative Example. The same electrical conduction test as the experiment in Example 1 was executed for the p-i-n diode according to the Comparative Example so that a bipolar operation was performed. Then, the anode electrode was removed and the photoluminescence emission of the epitaxial wafer was measured using a bandpass filter with a center wavelength of about 420 nanometers at room temperature. As a result, in the p-i-n diode according to the Comparative Example, as illustrated in a substantially white rectangular region in the top view of FIG. 10, bar-shaped stacking fault SFb expanding from the interface between the buffer layer and the substrate was observed. FIG. 10 illustrates a state in which the bar-shaped stacking fault SFb, which is elongated across between the upper end of the epitaxial wafer and the lower end of the epitaxial wafer, glows together with triangular-shaped stacking faults $SFt_1$ and $SFt_2$.

<Second Embodiment>

In a second embodiment, a combination mode of a main dopant and an auxiliary dopant and the concentration of the main dopant and the auxiliary dopant are the same as the combination mode in the first embodiment.

(Epitaxial Wafer Manufacturing Method)

Figure 11:
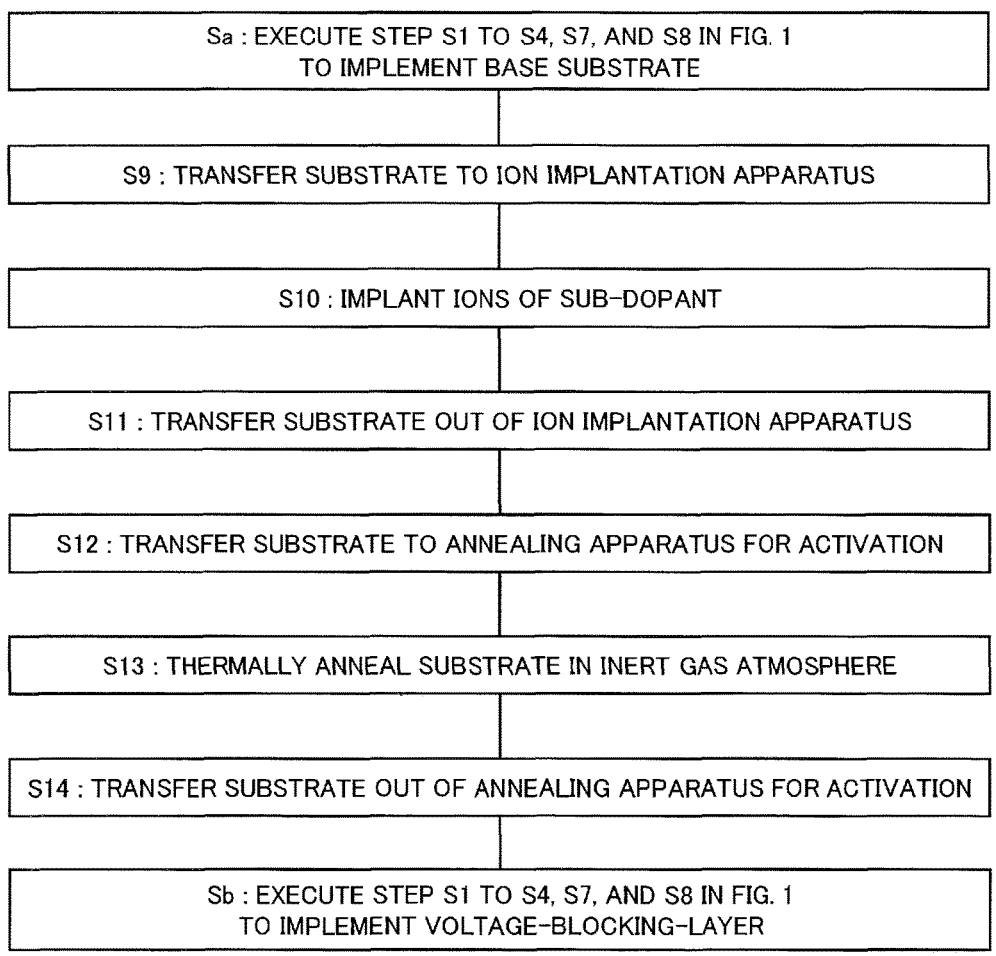
FIG. 11 is a flowchart illustrating an epitaxial wafer manufacturing method according to a second embodiment.

Next, an epitaxial wafer manufacturing method according to the second embodiment will be described with reference to FIG. 11.

First, Steps S1 to S4, S7, and S8 illustrated in FIG. 1 are executed (Step Sa) to manufacture a wafer (base substrate) in which a buffer layer doped with only the main dopant is grown on a substrate. Then, auxiliary dopant ions are implanted into the wafer by an ion implantation apparatus (Steps S9 to S11). Then, the implanted ions are activated by annealing the wafer, using an annealing apparatus for activation (Steps S12 to S14). Then, Steps S1 to S4, S7, and S8 illustrated in FIG. 1 are executed to implement a voltage-blocking-layer (Step Sb). In the above flowchart described, after ion implantation, the annealing for activation is executed. However, the annealing for activation may be executed after the voltage-blocking-layer is grown. In the case that the annealing may be performed after the deposition of the voltage-blocking-layer, Steps S12 to S14 are executed after Step Sb. As mentioned above, the epitaxial wafer according to the second embodiment is manufactured.

(Semiconductor Device Manufacturing Method)

Since a semiconductor device manufacturing method according to the second embodiment is the same as the semiconductor device manufacturing method according to the first embodiment described with reference to FIGS. 7 to 9, the description of the method according to the second embodiment will not be repeated. According to the semiconductor device manufacturing method of the second embodiment, similarly to the semiconductor device manufacturing method according to the first embodiment, it is possible to manufacture a semiconductor device which can effectively prevent the occurrence of bar-shaped stacking faults expanding from the interface between the buffer layer and the substrate during a bipolar operation with a large amount of current while suppressing the thickness of the buffer layer.

EXAMPLE 2

Next, Example 2 using the semiconductor device manufacturing method according to the second embodiment will be described. A substrate which was a SiC substrate was prepared and a Si-face of an n⁺-type 4H—SiC substrate which was 4° off from <11-20> direction and had a diameter (ϕ) of 3 inches was polished by chemical mechanical polishing (CMP) and the substrate was transferred into an epitaxial growth apparatus. Then, as source gases, $H_2$, $SiH_4$, $C_3H_8$, and $N_2$ were introduced in an atmosphere of a temperature of about 1680° C. and a pressure of about 10.3 kPa. $H_2$ was introduced at a flow rate of about $1.69 \times 10^2$ Pa·m³/s (about 100 slm), $SiH_4$ was introduced at a flow rate of about $143.65 \times 10^{-3}$ Pa·m³/s (about 85 sccm), $C_3H_8$ was introduced at a flow rate of about $38.87 \times 10^{-3}$ Pa·m³/s (about 23 sccm), and $N_2$ was introduced at a flow rate of about $84.5 \times 10^{-3}$ Pa·m³/s (about 50 sccm). A SiC single-crystalline layer was epitaxially grown with a thickness of about five micrometers for about 30 minutes. N was a main dopant.

Next, the substrate on which the SiC single-crystalline layer is grown was transferred to an ion implantation apparatus and was fixed in an implantation chamber. V ions were implanted into the single-crystalline layer with a dose of about $7 \times 10^{11}$ cm⁻². V was an auxiliary dopant. Then, a buffer layer was activated by annealing of the substrate. The doping concentration of V was less than the doping concentration of the main dopant and was equal to or greater than about $1 \times 10^{14}$ cm⁻³ and less than about $5 \times 10^{18}$ cm⁻³ in the buffer layer.

Next, similarly to the Example 1, among the epitaxial growth conditions of the buffer layer, the flow rate of $SiH_4$ was changed to about $312.65 \times 10^{-3}$ Pa·m³/s (about 185 sccm), the flow rate of $C_3H_8$ was changed to about $116.61 \times 10^{-3}$ Pa·m³/s (about 69 sccm), and the flow rate of $N_2$ was changed to about $8.45 \times 10^{-3}$ Pa·m³/s (about 5 sccm). The introduction conditions of the other source gases were the same as described above. Under the epitaxial growth conditions, the SiC single-crystalline layer was epitaxially grown for about seven hours. Then, a voltage-blocking-layer doped with N at a doping concentration of about $1 \times 10^{14}$ cm⁻³ was epitaxially grown with a thickness of about 120 micrometers on the buffer layer.

Then, Al ions as impurity elements was implanted for a portion of the upper part of the voltage-blocking-layer, to implement a pt-type anode region set to a box profile with a thickness of about 0.3 micrometer and a doping concentration of about $1 \times 10^{20}$ cm⁻³. In addition, an anode electrode was laminated on a top surface of the anode region and a cathode electrode was laminated on a bottom surface of the substrate. In order to improve the breakdown voltage of an end portion of the semiconductor device, Al ions were implanted around the anode region in the upper part of the voltage-blocking-layer to further implement p-type semiconductor regions having a lower concentration than the anode region. Then, a plurality of p-i-n diodes having a JTE structure was manufactured.

The lifetime of the minority-carriers in the buffer layer at a temperature of 250° C. was controlled and set to 80 nanoseconds by adjustment of the doping concentration of the main dopant and the auxiliary dopant. Then, an electrical conduction test was executed for each p-i-n diode at a current density of 600 A/cm² for about one hour and the frequency of occurrence of bar-shaped stacking faults was examined.

The results of the electrical conduction test provided that, in the p-i-n diode according to the Example 2 in which the buffer layer was implemented using ion implantation, even when the thickness of the buffer layer was about five micrometers, no bar-shaped stacking fault occurred and it was possible to achieve appropriately both to suppress an increase in the thickness of the buffer layer and to improve the quality of the p-i-n diode as a product, similarly to the Example 1.

In the semiconductor device manufacturing methods according to the first and second embodiments, the p-i-n diode has been described as an example. However, the semiconductor device is not limited to the p-i-n diode. For example, the present invention may be applied to a "p-n diode" or a "$p^+$-$n^+$ diode", such as a Zener diode or a tunnel diode, in which an i-layer or a semiconductor layer with low concentration approximate to the concentration of the i-layer is not interposed between p-n junctions.

In addition, the present invention can be applied to various semiconductor devices with a bipolar operation, such as a bipolar junction transistor, an IGBT, and a thyristor, or a semiconductor integrated circuit obtained by monolithically integrating these semiconductor devices. FIGS. 7 to 9 illustrate the semiconductor device in which the $n^+$-type buffer layer 22 and the $n^-$-type voltage-blocking-layer 23 are provided on the $n^+$-type substrate 21. However, the present invention is not limited to the above application. For example, the present invention may be applied to a structure in which a $p^+$-type buffer layer and an $n^-$-type voltage-blocking-layer are provided on a $p^+$-type substrate.

Furthermore, the present invention can be applied to, for example, a heterojunction bipolar transistor (HBT) in which a heterojunction between SiC and a semiconductor material with a forbidden bandwidth different from the forbidden bandwidth of SiC is used between an emitter and a base. In addition, the present invention may be applied to a unipolar device such as a MOSFET. Since a forward current flows to a body diode of the MOSFET during switching operation, the present invention is effective in preventing the occurrence of bar-shaped stacking faults.

FIG. 10 illustrates an example in which an upper base and a lower base of the bar-shaped stacking fault are linear in a top view. However, the present invention is effective in preventing the occurrence of bar-shaped stacking faults with other shapes. For example, the present invention can prevent the occurrence of bar-shaped stacking faults with various shapes, such as a rectangular bar-shaped stacking fault, a rectangular bar-shaped stacking fault in which the longer sides of the rectangle have a saw tooth shape, or bar-shaped stacking faults in which the width of a bar corresponding to the height of a trapezoid or the shorter side of a rectangle is not constant.

As described above, the present invention includes various embodiments that have not been described above and the technical scope of the present invention is defined by only specific matters of the present invention described in the appropriate claims of the present invention.

What is claimed is:

1. A method for manufacturing an epitaxial wafer comprising a silicon carbide substrate and a silicon carbide voltage-blocking-layer, the method comprising:
    epitaxially growing a buffer layer on the substrate, doping a main dopant for determining a conductivity type of the buffer layer and doping an auxiliary dopant for capturing minority carriers in the buffer layer at a doping concentration less than the doping concentration of the main dopant, so that the buffer layer enhances capturing and extinction of the minority carriers, the minority carriers flowing in a direction from the voltage-blocking-layer to the substrate, so that the buffer layer has a lower resistivity than the voltage-blocking-layer, so that bar-shaped stacking faults are prevented from occurring, and so that the buffer layer includes silicon carbide as a main component; and
    epitaxially growing the voltage-blocking-layer on the buffer layer.

2. The method according to claim 1, wherein the main dopant is doped at a doping concentration equal to or greater than $1.0 \times 10^{18}$ cm$^{-3}$ and less than $1.0 \times 10^{19}$ cm$^{-3}$.

3. The method according to claim 2, wherein the buffer layer is implemented with a thickness equal to or greater than 0.1 micrometer and equal to or less than five micrometers.

4. The method according to claim 3, wherein the auxiliary dopant is doped at a doping concentration less than the doping concentration of the main dopant and the doping concentration of the auxiliary dopant is equal to or greater than $1.0 \times 10^{14}$ cm$^{-3}$ and less than $5.0 \times 10^{18}$ cm$^{-3}$.

5. The method according to claim 4, wherein the main dopant and the auxiliary dopant are doped at the same time.

6. The method according to claim 4, wherein, after the main dopant is doped, the auxiliary dopant is doped.

7. The method according to claim 1, wherein
    the main dopant is nitrogen, and
    the auxiliary dopant includes at least one of aluminum, boron, vanadium, titanium, iron, and chromium.

8. The method according to claim 1, wherein
    the main dopant is aluminum, and
    the auxiliary dopant includes at least one of nitrogen, boron, vanadium, titanium, iron, and chromium.

9. A method for manufacturing an epitaxial wafer comprising a silicon carbide substrate and a silicon carbide voltage-blocking-layer, the method comprising:
    epitaxially growing a single-crystalline layer including silicon carbide as a main component on the substrate, doping a main dopant for determining a conductivity type of the single-crystalline layer;
    implanting ions of an auxiliary dopant for capturing minority carriers into the single-crystalline layer with a dose such that a doping concentration of the auxiliary dopant is less than the doping concentration of the main dopant;
    activating the ions to form a buffer layer using the single-crystalline layer, so that the buffer layer enhances capturing and extinction of the minority carriers, the minority carriers flowing in a direction from the voltage-blocking-layer to the substrate, and so that bar-shaped stacking faults are prevented from occurring and the buffer layer has a lower resistivity than the voltage-blocking-layer; and
    epitaxially growing the voltage-blocking-layer on the buffer layer.

10. An epitaxial wafer, comprising:
a silicon carbide substrate;
a silicon carbide voltage-blocking-layer; and
a buffer layer provided between the substrate and the voltage-blocking-layer, the buffer layer being doped with a main dopant for determining a conductivity type and an auxiliary dopant for capturing minority carriers, the auxiliary dopant having a lower doping concentration than the doping concentration of the main dopant, the buffer layer enhances capturing and extinction of the minority carriers, the minority carriers flowing in a direction from the voltage-blocking-layer to the substrate, the buffer layer being free of bar-shaped stacking faults, the buffer layer having a lower resistivity than the voltage-blocking-layer, and the buffer layer including silicon carbide as a main component.

11. A method for manufacturing a semiconductor device using an epitaxial wafer comprising a silicon carbide substrate and a silicon carbide voltage-blocking-layer, the epitaxial wafer manufactured by the method according to claim 1, the method comprising:
forming a semiconductor region of a second conductivity type in a portion of an upper part of the voltage-blocking-layer of a first conductivity type.

12. A method for manufacturing a semiconductor device using an epitaxial wafer comprising a silicon carbide substrate and a silicon carbide voltage-blocking-layer, the epitaxial wafer manufactured by the method according to claim 9, the method comprising:
forming a semiconductor region of a second conductivity type in a portion of an upper part of the voltage-blocking-layer of a first conductivity type.

13. A semiconductor device using the epitaxial wafer having the silicon carbide substrate and the silicon carbide voltage-blocking-layer, the epitaxial wafer according to claim 10, the semiconductor device comprising:
a semiconductor region of a second conductivity type provided in a portion of an upper part of the voltage-blocking-layer of a first conductivity type.

14. The method according to claim 1, wherein
the main dopant is doped at a doping concentration equal to or greater than $1.0 \times 10^{18}$ cm$^{-3}$ and less than $1.0 \times 10^{19}$ cm$^{-3}$, and
the auxiliary dopant is doped at a doping concentration less than the doping concentration of the main dopant and the doping concentration of the auxiliary dopant is equal to or greater than $1.0 \times 10^{14}$ cm$^{-3}$ and less than $5.0 \times 10^{18}$ cm$^{-3}$.

15. The method according to claim 1, wherein
the main dopant is doped at a doping concentration equal to or greater than $1.0 \times 10^{18}$ cm$^{-3}$ and less than $1.0 \times 10^{19}$ cm$^{-3}$,
the auxiliary dopant is doped at a doping concentration less than the doping concentration of the main dopant and the doping concentration of the auxiliary dopant is equal to or greater than $1.0 \times 10^{14}$ cm$^{-3}$ and less than $5.0 \times 10^{18}$ cm$^{-3}$, and
a lifetime of the minority carriers in the buffer layer is controlled to be less than sixty nanoseconds at temperatures between 50° Celsius and 250° Celsius.

16. The method according to claim 15, wherein the buffer layer is implemented with a thickness equal to or greater than 0.1 micrometer and equal to or less than five micrometers.

17. The method according to claim 1, wherein
the main dopant is nitrogen, and
the auxiliary dopant includes vanadium.

18. The method according to claim 17, wherein
the buffer layer is implemented with a thickness equal to or greater than 0.1 micrometer and equal to or less than five micrometers, and
a lifetime of the minority carriers in the buffer layer is controlled to be eighty nanoseconds at a temperature of 250° Celsius.

* * * * *